United States Patent [19]

Gill, Jr.

[11] Patent Number: 4,463,271

[45] Date of Patent: Jul. 31, 1984

[54] TRANSISTOR SWITCHING CIRCUITRY HAVING HYSTERESIS

[75] Inventor: Harry A. Gill, Jr., Cupertino, Calif.

[73] Assignee: Raytheon Company, Lexington, Mass.

[21] Appl. No.: 335,292

[22] Filed: Dec. 28, 1981

[51] Int. Cl.³ .................. H03K 5/153; H03K 5/24
[52] U.S. Cl. .................................... 307/350; 307/354; 307/359; 340/663
[58] Field of Search ............... 307/350, 354, 358, 359, 307/290, 296 R; 340/661, 662, 663

[56] References Cited

U.S. PATENT DOCUMENTS

| | | | |
|---|---|---|---|
| 2,939,018 | 5/1960 | Faulkner | 307/290 |
| 3,341,748 | 9/1967 | Kammiller | 340/661 |
| 3,820,099 | 6/1974 | Vogt | 340/663 |
| 4,184,087 | 1/1980 | Nutz | 307/354 |
| 4,259,601 | 3/1981 | Stein | 307/359 |
| 4,384,219 | 5/1983 | Davis | 307/354 |

*Primary Examiner*—John Zazworsky
*Attorney, Agent, or Firm*—Richard M. Sharkansky; Joseph D. Pannone

[57] ABSTRACT

A transistor switching circuit is provided for providing an indication of when the level of an input signal has passed through a first threshold level, such indication continuing unless such input signal has returned beyond the first threshold level to a second threshold level. Such circuit is useful in indicating whether the battery of a battery powered device should be replaced taking into consideration small variations in the output of the battery after the initial replacement indication has been provided.

10 Claims, 10 Drawing Figures

4,463,271

TRANSISTOR SWITCHING CIRCUITRY HAVING HYSTERESIS

BACKGROUND OF THE INVENTION

This invention relates generally to transistor switching circuitry and more particularly to transistor switching circuitry having hysteresis.

As is known in the art, it is frequently desirable to provide a transistor switching circuit with hysteresis. For example, it is frequently desirable to provide a transistor switching circuit which will change the state of an output signal when an input signal level passes through a first threshold level but which will not return the output signal to its original state unless the input signal returns to the first threshold and passes through such first threshold to a second different threshold level. Because the switching circuit has a second threshold level different from the first threshold level once the input signal has first passed through the first threshold level, the switching circuit is said to have hysteresis.

SUMMARY OF THE INVENTION

In accordance with the present invention, a transistor switching circuit is provided having: means for producing a first current or a second, different, current; voltage producing means, responsive to the produced current, for producing a voltage related to the produced current; and switching means, responsive to the voltage produced by the voltage producing means and an input signal, for changing the produced current from the first current to the second current when the level of the input signal passes through a first threshold level and for preventing the produced current from changing from the second current until the input signal returns to the first threshold level and passes through the first threshold level to a second, different, threshold level.

In a preferred embodiment of the invention the switching means includes a comparator means, having a pair of transistors, for passing current through either a first one of the pair of transistors or the second one of the pair of transistors selectively in accordance with the difference in levels between the level of a reference signal fed to the base electrode of a first one of the pair of transistors and the level of a voltage fed to the base electrode of a second one of the pair of transistors. The current producing means produces a current having the first current when the first one of the pair of transistors passes current and having the second, different current when the second one of the pair of transistors passes current. The voltage producing means is coupled between the input signal and the base electrode of the second one of the pair of transistors and is responsive to the current produced by the current producing means, for producing at the base electrode of the second one of the pair of transistors, a voltage equal to the reference voltage when the input signal initially passes through the first threshold level and when such input signal returns beyond the first threshold level and passes through the second threshold level. The current producing means includes a current source circuit connected to one of the pair of transistors. The current source circuit includes a current mirror having a pair of transistors with a common base electrode with emitter electrodes coupled together; the emitter area of a first one of the pair of transistors being different from the emitter area of a second one of the pair of transistors.

BRIEF DESCRIPTION OF THE DRAWINGS

For a more complete understanding of the invention, reference is now made to the following description taken together in conjunction with the accompanying drawings, in which.

DESCRIPTION OF THE PREFERRED EMBODIMENT

Figure 1:
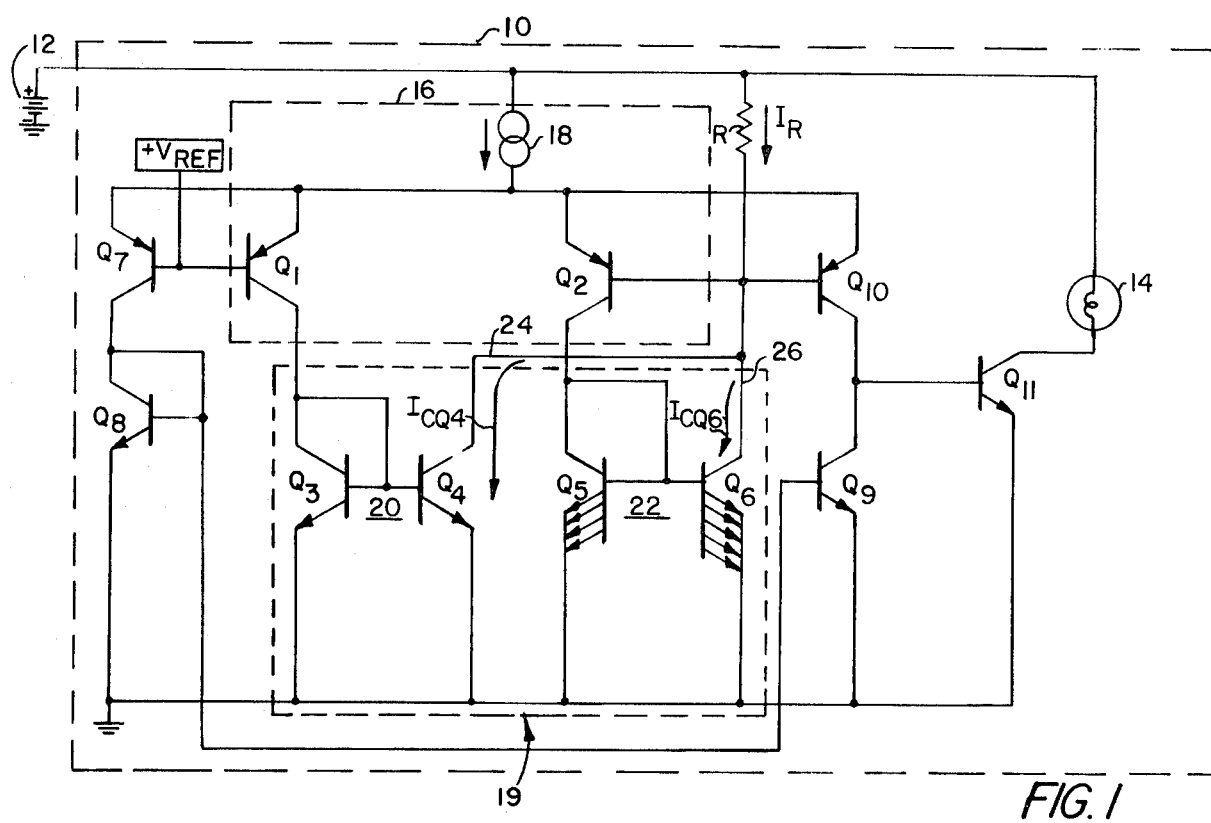
FIG. 1 is a schematic diagram of a transistor switching circuit according to the invention.

Referring now to FIG. 1 a transistor switching circuit 10 is shown. Such transistor switching circuit 10 is here used to provide an indication when the battery 12 is "low". More particularly, the circuit 10 turns an indicator light 14 "on" when the voltage produced by the battery 12 falls below a first predetermined threshold level. For example, here the battery 12 is a 9 volt battery of the type used in many portable recorders and circuit 10 will turn indicator light 14 "on" when the voltage of battery 12 falls below 6 volts to indicate to the user of the portable recorder that the battery 12 is "low" and hence inadequate for prolonged operation of the recorder. Further, switching circuit 10 has hysteresis such that if the level of the battery has fallen below the predetermined level, here 6 volts, to turn indicator light 14 "on", if the battery 12 should then rise slightly above the predetermined 6 volt level, because of a change in load or environment, the circuit 10 maintains the indicator light 14 "on" to indicate that the battery 12 is still "weak" and not suitable for a prolonged recording and hence that battery 12 should be changed. Thus here the indicator light 14 will remain "on" unless battery 12 is recharged or replaced so that its output voltage is substantially greater than the 6 volt threshold level. More particularly, the indicator light 14 will remain "on" until the level of the voltage of the recharged, or replaced, battery is greater than a second higher predetermined threshold level, here 7.2 volts.

Transistor switching circuit 10 includes a comparator circuit 16 having a pair of transistors $Q_1$, $Q_2$ with emitter electrodes connected to the positive terminal (+) of the battery 12 through a current source 18, as shown. Current source 18 is of any conventional design and here produces a current of 13 microamps. The base electrode of transistor $Q_1$ is connected to a reference voltage source $+V_{REF}$, here a conventional band-gap reference producing a reference voltage of 1.3 volts. The base electrode of transistor $Q_2$ is connected to the positive terminal of battery 12 through a precision resistor R, as shown. The collector electrodes of transistors $Q_1$, $Q_2$ are connected to a circuit 19 made up of a pair of current source circuits 20, 22; current source circuit 20 being connected to the collector electrode of transistor $Q_1$ and current source circuit 22 being connected to the collector electrode of transistor $Q_2$ as shown. The outputs of lines 24, 26 of current source circuits 20, 22 are connected to the base electrode of transistor $Q_2$, as shown. It is noted that when the voltage at the base electrode of transistor $Q_2$ is greater than the voltage of the reference voltage source $+V_{REF}$, here 1.3 volts, (as will be the case when the battery 12 is "strong" or "fresh" and produces an output voltage of 9 volts) transistor $Q_1$ will conduct current from current source 18 and transistor $Q_2$ will be in a nonconducting mode. When transistor $Q_1$ conducts, a current will be produced on output line 24 of current source circuit 20, the level of such current being substantially equal to the current through the collector electrode of transistor $Q_1$. Here such current will be about 6.5 microamps for reasons to be discussed hereinafter. Suffice it to say here, however, that the 6.5 microamp current through line 24 passes through resistor R. Here the resistance of resistor R is selected to establish a voltage at the base electrode of transistor $Q_2$ equal to the difference in the voltage produced by the voltage reference source $+V_{REF}$ and the first predetermined threshold voltage, here 6 volts. That is, here the resistance of resistor R is selected to produce a 4.7 volt drop across it in response to the 6.5 microamps passing through such resistor, R, and through the output conductor 24 of current source circuit 20. Therefore, the resistance of resistor R is here $(4.7/6.5) \times 10^6$ ohms = 723 Kohms. Thus, current source circuit 20 and resistor R produce a first predetermined threshold voltage, here 6 volts, for the comparator circuit 16. That is, if the voltage of battery 12 falls from the initial 9 volt level to below the 6 volt threshold level, the voltage at the base electrode of transistor $Q_2$ falls below the 1.3 volt reference at the base electrode of transistor $Q_1$ and transistor $Q_2$ will conduct while transistor $Q_1$ is placed in a nonconducting mode. The current through output conductor 24 stops and a current is produced through output conductor 26 of the current source circuit 22. The level of the current produced on output line 26 is here larger than the current produced on output line 24 when transistor $Q_1$ was conducting and transistor $Q_2$ was in the nonconducting mode. More particularly, while the current through the collector of transistor $Q_2$ is the same as that which previously passed through the collector of transistor $Q_1$, when transistor $Q_1$ was conducting, here 6.5 microamps, the current source circuit 22 now produces a current on output line 26 greater than 6.5 microamps, here 1.25 times greater or a current on output line 26 of here 8.125 microamps. Thus, in response to this level of higher current on output line 26, resistor R produces a correspondingly higher voltage drop than that produced when the current through such resistor R passed through output line 24. Thus, here the voltage drop across resistor R is now 5.87 volts. It follows then that transistor $Q_2$ will continue to conduct and transistor $Q_1$ will remain in a nonconducting mode until the voltage at the positive terminal (+) of battery 12 reaches a level equal to the sum of the reference voltage source $+V_{REF}$, here 1.3 volts and the voltage drop produced across resistor R, here now 5.87 volts; that is, until the voltage at the positive terminal (+) of battery 12 increases to 7.2 volts. It follows then that the effective threshold level of the comparator circuit 24 has increased from 6 volts to 7.2 volts. In this way, indicator light 14 will turn "on" to warn the user of a low battery when the voltage level of battery 12 falls below the first threshold level, here 6 volts, and such indicator light will remain on to provide such warning if there are relatively small increases in the voltage of battery 12, here increases less than 1.2 volts, as may occur from loading or environmental changes in the battery. However, indicator light 14 will go "off" if battery 12 is recharged or replaced, so that it produces an output voltage greater than 7.2 volts.

It follows then that the first threshold voltage $V_{T1} = 6$ volts is equal to the sum of the reference voltage $V_{REF}$ and the voltage drop produced in response to the first current, $I_{CQ4}$, passing through resistor R, i.e. $V_{T1} = V_{REF} + RI_{CQ4}$ and the second threshold level $V_{T2} = 7.2$ volts is equal to the sum of the reference voltage, $V_{REF}$, and the voltage produced across resistor R in response to the second current, $I_{CQ6}$, passing through resistor R, i.e. $V_{T2} = V_{REF} + RI_{CQ6}$.

Referring now in more detail to circuit 19, current source circuit 20 is shown to include a current mirror having a "diode connected" transistor $Q_3$, having its collector electrode connected to the collector electrode of transistor $Q_1$ and to its base electrode and also to the base electrode of transistor $Q_4$. The emitter electrode of transistors $Q_3$ and $Q_4$ are connected to ground (and hence the grounded negative (−) terminal of battery 12). Here the emitter area of transistor $Q_3$ is equal to the emitter area of transistor $Q_4$ so that the current through the collector of transistor $Q_4$, (i.e. $I_{CQ4}$) which is connected to output line 24, will be equal to the current through the collector electrode of transistor $Q_1$. Current source circuit 22 includes a current mirror having a "diode connected" transistor $Q_5$ having its collector electrode connected to the collector electrode of transistor $Q_2$ and to both its base electrode and to the base electrode of transistor $Q_6$. The collector electrode of transistor $Q_6$ is connected to output line 26. The emitter electrodes of transistors $Q_5$ and $Q_6$ are connected to ground. It is noted that the emitter area of transistor $Q_5$ is here four times larger than the emitter area of either one of the transistors $Q_3$, $Q_4$ while the emitter area of transistor $Q_6$ is five times larger than the emitter area of either one of the transistors $Q_3$, $Q_4$. Thus, the emitter area of transistor $Q_6$ is greater than, here 1.25 times greater than the emitter area of transistor $Q_5$. Thus, the current through the collector electrode of transistor $Q_6$ (i.e. $I_{CQ6}$) is thus here 1.25 times greater than the current through the collector electrode of transistor $Q_2$. Lines 24 and 25 are connected to the base electrode of transistor $Q_2$, as shown.

The switching circuit 10 includes a transistor $Q_7$ and a "diode connected" transistor $Q_8$; transistor $Q_7$ having its emitter electrode connected to the current source 18, its base electrode connected to the base electrode of transistor $Q_1$ and its collector electrode connected to the diode connected transistor $Q_8$. Transistor $Q_8$ has its collector connected to: the collector electrode of transistor $Q_7$; the base electrode of transistor $Q_8$, and the base electrode of transistor $Q_9$. The emitter electrode of transistor $Q_8$ is connected to ground. Transistor $Q_9$ has its emitter electrode connected to ground, and its collector electrode connected to the collector electrode of transistor $Q_{10}$ and to the base electrode of transistor $Q_{11}$. The base electrode of transistor $Q_{10}$ is connected to the base electrode of transistor $Q_2$ and the emitter electrode of transistor $Q_{10}$ is connected to the current source 18, as shown. The collector electrode of transistor $Q_{10}$ is connected to the base electrode of transistor $Q_{11}$. The emitter electrode of transistor $Q_{11}$ is connected to ground and the collector electrode of transistor $Q_{11}$ is connected to the positive (+) terminal of battery 12 through the indicator light 14, as shown.

In operation, when the voltage of battery 12 is greater than 9 volts, transistors $Q_1$ and $Q_7$ conduct and transistors $Q_2$ and $Q_{10}$ are placed in a nonconducting mode. In such condition the 13 microamps of current source 18 divides equally between transistors $Q_1$ and $Q_7$. Thus, 6.5 microamps pass through the collector electrode of transistor $Q_8$ to place transistor $Q_9$ into saturation thereby producing a relatively low voltage at the base of transistor $Q_{11}$ so that transistor $Q_{11}$ is "off" and no current through the indicator light 14 with the result that such light 14 is "off". Further 6.5 microamps also passes through the collector electrode of transistor $Q_1$. Thus transistor $Q_4$ produces an output current on line 24 equal to 6.5 microamps and since R is here 723 kohms a voltage of here 4.7 volts is produced across resistor R.

Figure 2A:
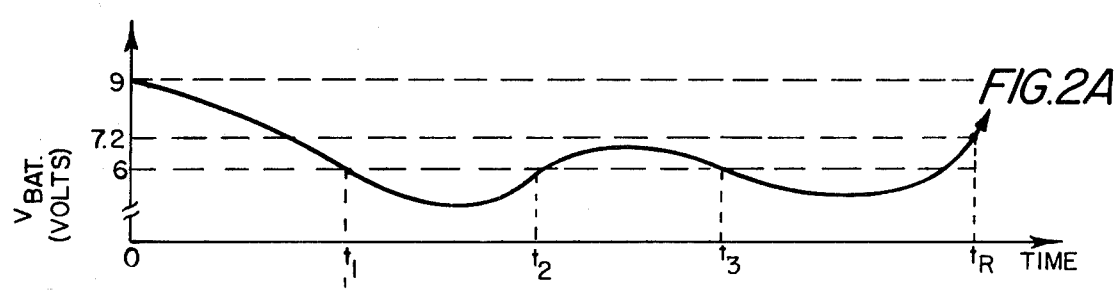
FIGS. 2A–2D are time histories of various voltage and current levels generated in the transistor switching circuit of FIG. 1.
Figure 2B:
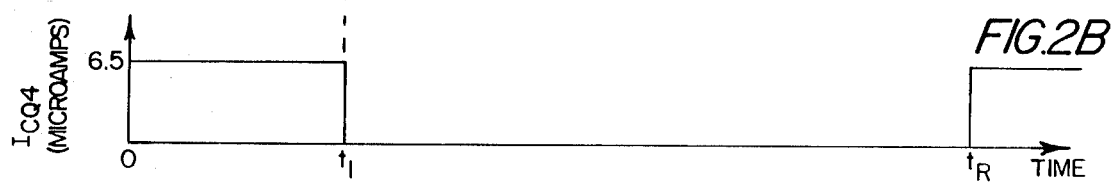
Figure 2C:
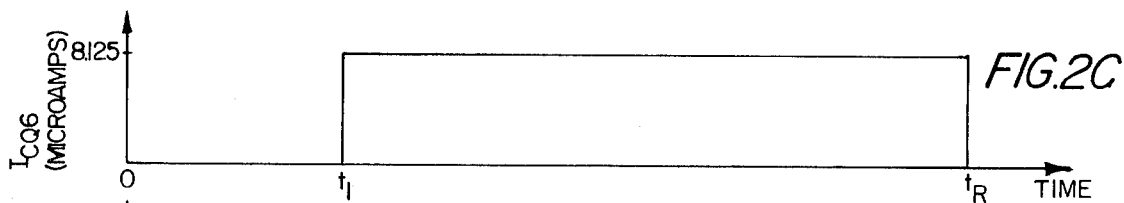
Figure 2D:
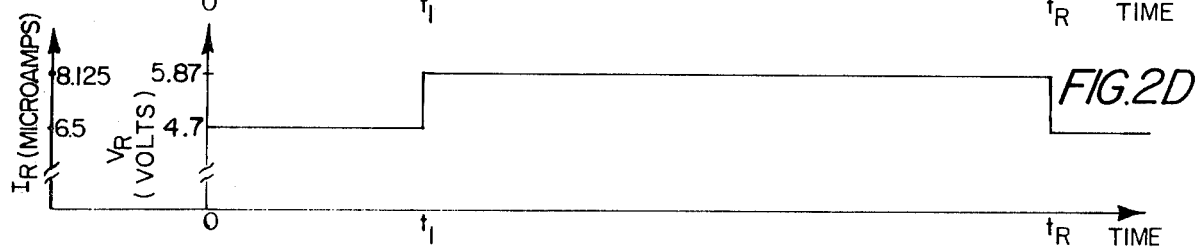

As the battery 12 ages with time its output voltages reduce as shown in FIG. 2A. When the output voltage falls below 6 volts, at time $t_1$, the voltage at the base electrode of transistor $Q_2$ falls below the 1.3 volts at the base electrode of transistor $Q_1$ so that transistors $Q_1$ and $Q_7$ are placed in a nonconducting mode and transistors $Q_2$ and $Q_{10}$ become conducting. Again the current from current source 18 divides equally between transistors $Q_2$ and $Q_{10}$. Transistor $Q_8$ and $Q_9$ turns off so that the base electrode of transistor $Q_{11}$ is high enough to drive transistor $Q_{11}$ into conduction and that current passes from battery 12 to ground through transistor $Q_{11}$ and indicator light 14 placing such light 14 "on" to warn of a low battery. Further, the 6.5 microamp current through the collector of transistor $Q_2$ is monitored by current mirror 22. In particular, the 6.5 microamp current through the collector electrode of transistor $Q_2$ is mirrored by the current through transistor $Q_6$; here, however, as noted above, because the emitter area of transistor $Q_6$ is 1.25 times greater than the emitter area of transistor $Q_5$ a current of $(6.5) \times (1.25) = 8.125$ microamps passes through the collector of transistor $Q_6$ (i.e. $I_{CQ6}$). Thus, referring to FIGS. 2A to 2D, when the battery voltage drops below 6 volts the current through the collector electrode of transistor $Q_4$ (i.e. $I_{CQ4}$) as shown in FIG. 2B switches at time $t_1$, from 6.5 microamps to zero while the current through transistor $Q_6$ (i.e. $I_{CQ6}$) switches at time $t_1$, from zero to 8.125 microamps as shown in FIG. 2C. Thus, the current through resistor R, i.e. $I_R$, changes from an initial value of 6.5 microamps to a second higher level of 8.125 microamps at time $t_1$ and the voltage drop across resistor R (i.e. $V_R$) across resistor R correspondingly increases from 4.7 volts to 5.87 volts at time $t_1$, as shown in FIG. 2D. Thus, transistor $Q_2$ remains conducting until the voltage at its base electrode rises to a level above the 1.3 volt reference level at the base electrode of transistor $Q_1$ and such voltage will not rise above this 1.3 volt level until the voltage at the positive terminal of battery 12 raises to a level above $(1.3 + 5.87)$ or approximately 7.2 volts, where the 5.87 volts is the new voltage drop $V_R$ produced across resistor R in response to the 8.125 microamps ($I_R$) now passing through such resistor R via transistor $Q_6$, as shown in FIG. 2D. Thus, if the voltage of the battery now rises to a level between 6 volts and 7.2 volts, as shown in FIG. 2A, during the period of time between time $t_2$ and time $t_3$, the light 14 will remain "on" to warn of a low battery. When the battery 12 is replaced or recharged so that its output voltage increases beyond the 7.2 volt level as at time $t_R$ in FIG. 2A, the collector current of transistor $Q_4$ again increases to 6.5 microamps, transistor $Q_{11}$ goes "off" to turn light 14 "off" and the voltage across resistor R returns to 4.7 volts as shown in FIG. 2D.

Figure 3:
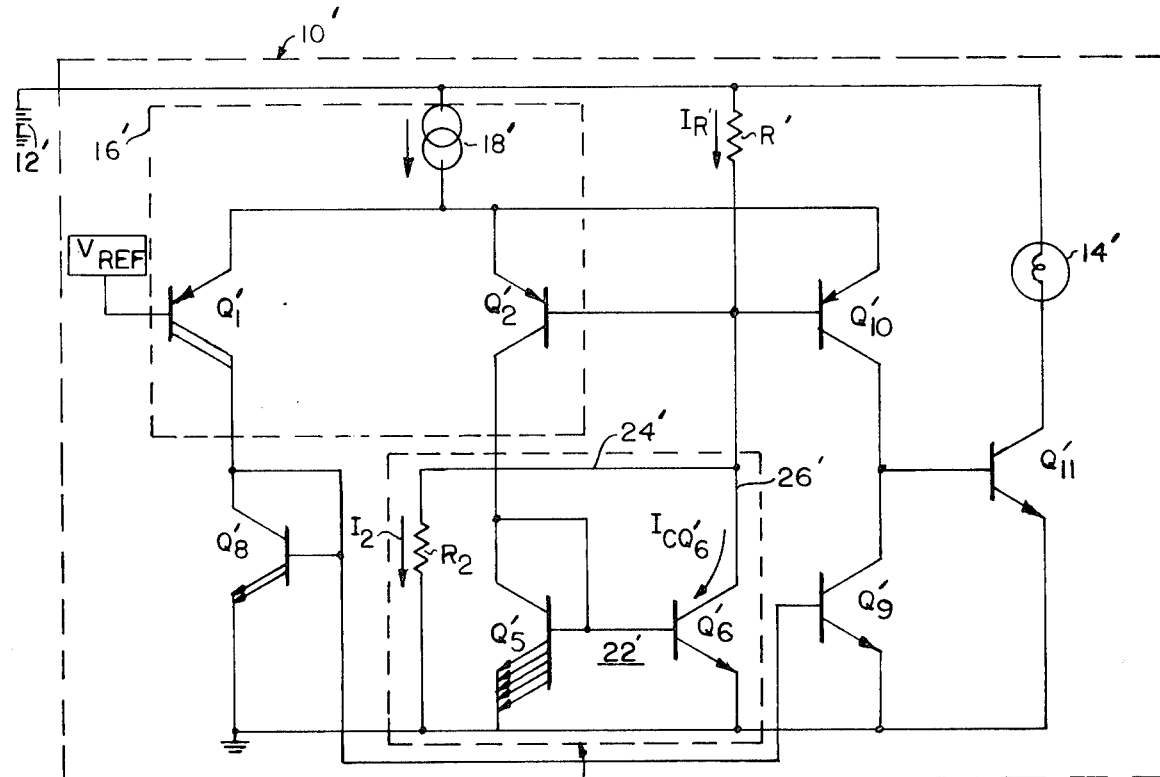
FIG. 3 is a schematic diagram of an alternative embodiment of a transistor switching circuit according to the invention.

Referring now to FIG. 3 a transistor switching circuit 10' is shown to provide an indication of when the battery 12', (here nominally a nine volt battery as in the circuit 10 of FIG. 1) is "low" by turning indicator light 14' "on" when the voltage produced by battery 12' falls below a first predetermined threshold level, here 6 volts, and such indicator light 14' will remain "on" until the battery is recharged, or replaced, so that its output is greater than a second, higher, predetermined threshold level, here 7.2 volts.

The transistor switching circuit 10' includes a comparator circuit 16' having a pair of transistors $Q_1'$, $Q_2'$ with emitter electrodes connected to the positive terminal of battery 12' through a current source 18', as shown (here such current source 18' produces 13 microamps of current). The base electrode of transistor $Q_2'$ is connected to the positive terminal of battery 12' through a precision resistor R' as shown, the base electrode of transistor $Q_{10}'$, and the circuit 19', as shown. The collector electrode of transistor $Q_2'$ is connected to circuit 19'. Circuit 19' includes (1) a resistor $R_2$ connected to ground (and hence the negative terminal of battery 12') and, via output bus 24', to the base electrode of transistor $Q_2'$, as shown; and (2) to a current mirror circuit 22' including a diode connected transistor $Q_5'$ having its collector electrode connected to the collector electrode of transistor $Q_2'$ and to both its base electrode and to the base electrode of transistor $Q_6'$. The collector electrode of transistor $Q_6'$ is connected to the base electrode of transistor $Q_2'$ via output line 26', as shown. The emitter electrode of transistor $Q_5'$ and $Q_6'$ are connected to ground. It is noted that the emitter electrode of transistor $Q_5'$ is here five times larger than the emitter area of transistor $Q_6'$.

In operation, when the voltage of battery 12' is initially greater than 6 volts transistor $Q_1'$ conducts and transistors $Q_2'$ and $Q_{10}'$ are placed in nonconducting modes. In such condition, the 13 microamps of current source 18' passes through the collector of diode connected transistor $Q_8'$ here having an emitter area twice that of transistor $Q_8$ in FIG. 1, so that 13 microamps passes through the collector electrode of transistor $Q_8'$ placing transistor $Q_9'$ in saturation and thereby producing a relatively low voltage at the base of transistor $Q_{11}'$ so that such transistor is "off" and no current passes through the indicator light 14' with the result that such light 14' is "off". Under such condition, the current passing through resistor R' via output line 24' is $I_{R'} = I_{R'1} = V_{BAT}/(R' + R_2)$ where $V_{BAT}$ is the output of battery 12' and the voltage at the base electrode of transistor $Q_2'$ (i.e. $V_{BQ'2}$) is $V_{BQ'2} = V_{BAT} R_2/(R' + R_2)$. Since here we have selected as a first predetermined threshold voltage 6 volts, the resistors R' and $R_2$ are selected to produce a voltage of 1.3 volts (i.e. $V_{REF}$) when the battery voltage $V_{BAT}$ falls to 6 volts. Here R' = 940 Kohms and $R_2$ is 260 Kohms. Thus, $V_{BQ'2}$ goes from initially 1.95 volts, when $V_{BAT} = 9$ volts to 1.3 volts when $V_{BAT}$ falls to 6 volts.

Figure 4A:
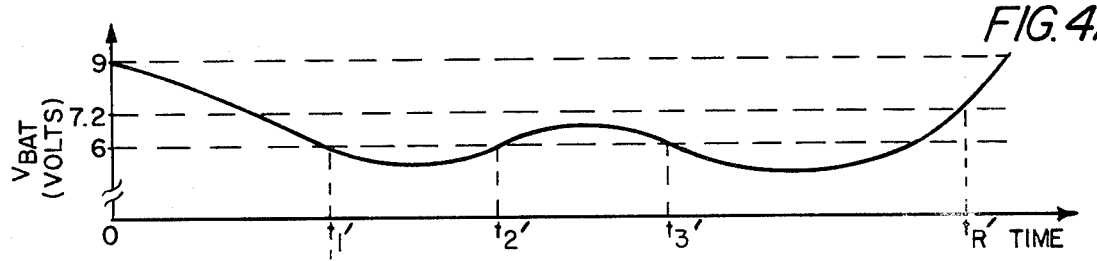
FIGS. 4A–4D are time histories of various voltages and current levels generated in the transistor switching circuit of FIG. 3.
Figure 4B:
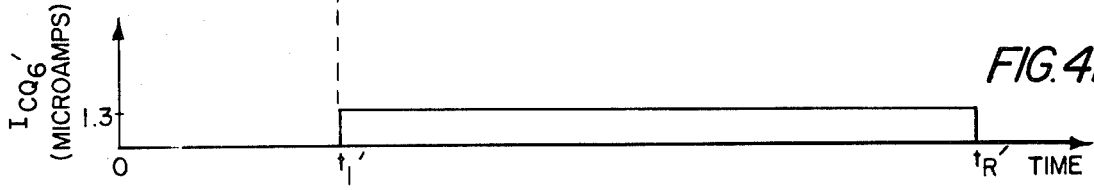
Figure 4C:
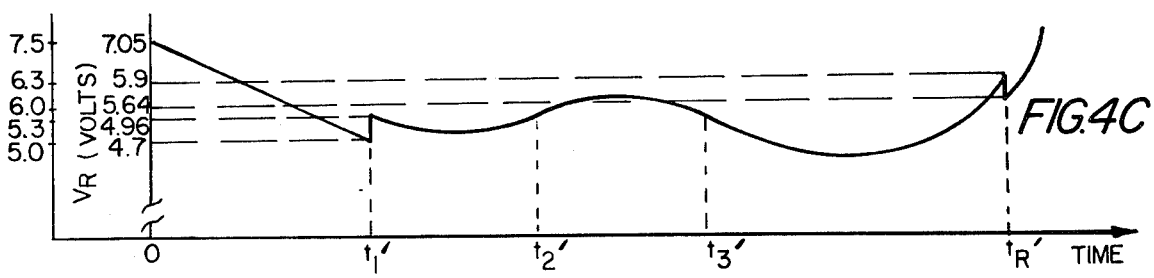
Figure 4D:
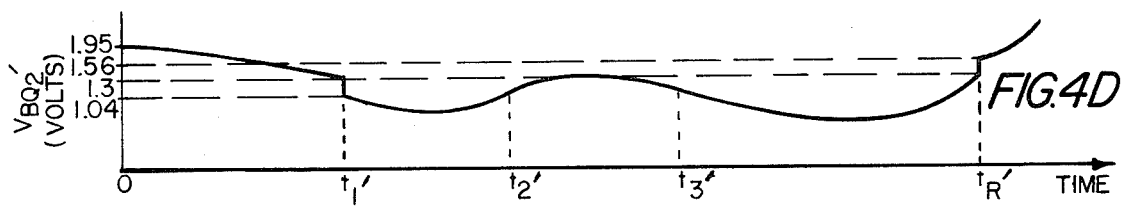

When the voltage of the battery falls below 6 volts, the voltage $V_{BQ'2}$ falls below the 1.3 reference voltage at the base of transistor $Q_1'$ with the result that transistors $Q_1'$ and $Q_9'$ go to nonconducting states so that transistor $Q_{11}'$ goes "on" and light 14' goes "on" to indicate a low battery. Further, transistor $Q_2'$ is placed in a conducting mode. Thus, the 13 microamps of current source 18' divides equally between transistors $Q_2'$ and $Q_{10}'$. Further, since the emitter area of transistor $Q_5'$ is five times greater than the emitter area of transistor $Q_6'$, current source 22' acts as a current source providing $6.5/5 = 1.3$ microamps of current through output line 26'. Thus, when the voltage $V_{BAT}$ passes through the first, here 6 volts, threshold level a second current passes through R', i.e. $I_R'=I_R'_2$. That is, once the voltage of battery 12' has decreased below the 6 volt threshold level at time $t'_1$ (FIG. 4A) the voltage at the base of transistor $Q_2'$ may be expressed as $V_{BQ2'}=V_{BAT}-R'I_R'_2=V_{BAT}-R'(I_{CQ'6}+I_2)$ where $I_{CQ'6}$ is the current through the collector electrode of transistor $Q'_6$ and $I_2$ is the current through resistor $R_2$. Since $I_2=V_{BQ'2}/R_2$ it follows that $V_{BQ2'}$ now may be represented as $V_{BQ'2}=[R_2(V_{BAT}-R'I_{CQ'6})/(R'+R_2)]$. Since here $I_{CQ'6}$ is here 1.3 microamps, $V_{BQ2'}$ may be expressed as $[0.217 V_{BAT}-0.26]$ volts, as shown in FIG. 4D. The second current $I_R'_2$ may be expressed as $I_R'_2=(V_{BAT}-V_{BQ'2})/R'=V_{BAT}/(R'+R_2)+I_{CQ'6}[R_2/(R'+R_2)]=I_R'_1+I_{CQ'6}(R'/(R'+R_2))$. Thus, the second current is the first current, $I_R'_1$, plus an additional current $I_{CQ'6}(R'/(R'+R_2))$. It is noted that the voltage at the base electrode of transistor $Q_2'$ remains below the 1.3 volt threshold level at the base of transistor $Q_1'$ even though the battery voltage rises above 6 volts, as during the period of time between $t_2'$ and $t_3'$, as shown in FIG. 4D. At time $t_R'$, however, the battery voltage rises to 7.2 volts and the voltage $V_{BQ2'}$ now passes through the 1.3 reference voltage. Therefore, transistors $Q_2'$ and $Q_{10}'$ are placed in a nonconducting mode while transistor $Q_1'$ is returned to its conducting condition. Therefore, the current through resistor R' returns to the first current $I_R'_1$ and the voltage at the base of transistor $Q_2'$ may again be expressed as $V_{BQ'2}=V_{BAT}R_2/(R'+R_2)$. Thus, light 14 turns "off" after the battery 12 produces a voltage greater than the second, 7.2 volt, threshold level. It follows then that the first threshold voltage $V_{T'1}=6$ volts is equal to the sum of the reference voltage, $V_{REF}$, and the voltage drop produced across resistor R' in response to the first current, $V_{REF}/R_2$; i.e. $V_{T'1}=V_{REF}+(V_{REF}/R_2)$ and the second threshold voltage $V_{T'2}=7.2$ volts is equal to the sum of the reference voltage, $V_{REF}$, and the voltage drop produces across resistor R' in response to the second current, $(V_{REF}/R_2)+I_{CQ'6}$, i.e. $V_{T'2}=V_{REF}+[(V_{REF}/R_2)+I_{CQ'6}]R'$.

Having described a preferred embodiment of the invention, it will now be apparent to one of skill in the art that other embodiments incorporating this concept may be used. It is felt, therefore, that this invention should not be restricted to the disclosed embodiment but rather should be limited only by the spirit and scope of the appended claims.

What is claimed is:

1. A switching circuit, comprising:
    (a) comparator means, having: a current source for producing a reference current; a first input fed by a first voltage; and, a second input, such comparator means directing the reference current to either a first one of a pair of outputs or a second one of the pair of outputs selectively in accordance with whether the first voltage is greater than, or less, than a voltage at the second input;
    (b) means, including a current mirror fed by the current directed from the current source to the first one of the pair of outputs, for producing a constant current in response to the directed current fed thereto, such constant current having a level independent of an input signal fed to the switching circuit when the current from the current source is directed to the first one of the pair of outputs; and
    (c) means, responsive to said input signal, for producing a voltage at the second input of the comparator means equal to the first voltage when said input signal initially passes through a first threshold level and for producing, in response to the constant current and the input signal, the same voltage at the second input when said input signal passes to a second, different threshold level having previously returned to the first threshold level and having then subsequently passed through such first threshold level to the second, different threshold level.

2. A switching circuit comprising:
    comparator means having: a current source; a first input fed by a first voltage; and, a second input, fed by a second voltage, for directing current from the current source to either a first one of a pair of outputs or a second one of the pair of outputs selectively in accordance with the difference in the first and second voltages;
    an input signal source for producing an input signal;
    a voltage producing means coupled between the input signal source and the second input;
    means, including a current mirror fed by current directed from the current source to a first one of the pair of outputs for producing an output current in response to the current fed thereto having a level independent of said input signal during the time the current from the current source is directed to the first one of the pair of outputs, for producing a first current through the voltage producing means until said input signal passes through a first threshold level and for producing and maintaining a second current through the voltage producing means after said input signal passes through the first threshold level and until said input signal subsequently passes through the first threshold level to a second, different threshold level, such second current including the output current produced by the current mirror.

3. The switching circuit rectied in claim 2 wherein the first threshold level is equal to the sum of the reference voltage and the voltage produced by the voltage producing means in response to the first current and the second threshold level is equal to the sum of the reference voltage and the voltage produced by the voltage producing means in response to the second current.

4. A switching circuit, comprising:
    (a) current source means for producing a current having either a first level or a second, different level;
    (b) voltage producing means responsive to the produced current, for producing a first voltage at an output thereof when the produced current has the first level and for producing a second, different voltage at the output thereof when the produced current has the second level;
    (c) switching means, having a first input coupled to the output of the voltage producing means and responsive to the voltage producing means and an input signal, for changing the level of the produced current from the first level to the second level when the level of said input signal passes through a first threshold level and for preventing the level of the produced current from changing from the second level to the first level until said input signal returns beyond the first threshold level and passes through a second, different threshold level, such switching means, comprising: a comparator means having a reference current source and a pair of transistors, for directing current from the reference current source through either a first one of the pair of transistors or the second one of the pair of transistors selectively in accordance with the difference between a reference signal fed to a base electrode of the first one of the pair of transistors and the voltage produced at the output of the voltage producing means and coupled to a base electrode of a second one of the pair of transistors; and (d) wherein the current source means comprises a current mirror coupled to the second one of the pair of transistors, such current source means producing the current having the first level when the first one of the pair of transistors passes current and for producing the current having the second, different level when the second one of the pair of transistors passes current, such current having the second level being produced in response to reference current fed thereto through the second one of the pair of transistors in the comparator means, such second current level being independent of the input signal when the second one of the pair of transistors passes the reference current, such second current being produced by the current mirror in response to current from the reference current being directed to such current mirror through the second one of the pair of transistors.

5. The circuit recited in claim 4 wherein the voltage producing means is coupled between the input signal and the base electrode of the second one of the pair of transistors, and wherein such voltage producing means is responsive to the level of current produced by the current source means for producing, at the base electrode of the second one of the pair of transistors, the first voltage when the produced current has the first level and the second, different voltage when the produced current has the second, different level.

6. The circuit recited in the claim 5 wherein the current source means includes a pair of transistors with a common base electrode and with emitter electrodes coupled together, the emitter area of a first one of the pair of transistors being different from the emitter area of a second one of the pair of transistors, the collector electrode of one of the pair of transistors being coupled to one of the pair of transistors of the comparator means and a collector electrode of the collector electrode of the other one of such pair of transistors being coupled to the base electrode of such one of the pair of transistors of the comparator means.

7. A circuit comprising:
(a) comparator means, comprising:
  (i) a current source;
  (ii) a first voltage source;
  (iii) a pair of transistors, a first one of the pair of transistors having: a base electrode coupled to the first voltage source; and, a first electrode connected to the current source, and a second one of the pair of transistors having: a first electrode connected to the current source; and a base electrode,
  for directing current from the current source through either the first one or the second one of the pair of transistors selectively in accordance with voltages at the base electrodes of the pair of transistors;

(b) voltage producing means, having a first terminal coupled to an input signal and a second terminal coupled to the base electrode of the second one of the pair of transistors, for producing a voltage between the first terminal and the second terminal related to a current through such voltage producing means; and (c) a current mirror having an input connected to a second electrode of the second one of the pair of transistors of the comparator means, and fed by the current source when current from such current source is directed through the second one of the transistors, such current mirror having an output connected to the second terminal of the voltage producing means, such current mirror producing an output current at the output thereof which mirrors, in a predetermined ratio, the current fed by the current source to the input of such current mirror.

8. The circuit recited in claim 7 wherein the current mirror comprises a diode connected transistor connected to the second electrode of the second one of the pair of transistors of the comparator means and an output transistor having base and emitter electrodes connected to the base and emitter electrode of the diode connected transistor and having a collector electrode connected to the base electrode of the second one of the pair of transistors of the comparator means, the emitter area of the output transistor of the current mirror being different from the emitter area of the diode coupled transistor.

9. The circuit recited in claim 8 including additionally: a second diode coupled transistor connected to a second electrode of a first one of the pair of transistors of the comparator means; and a second output transistor having base and emitter electrodes connected to the base and emitter electrodes of the second diode coupled transistor and a collector electrode connected to the base electrode of the second one of the pair of transistors of the comparator means.

10. The circuit recited in claim 8 including additionally a resistor coupled between the base electrode of the second one of the pair of transistors of the comparator means and the emitter electrode of the diode connected transistor.

* * * * *